United States Patent [19]

Culligan et al.

[11] Patent Number: 4,516,185
[45] Date of Patent: May 7, 1985

[54] TIME RATIO CONTROL CIRCUIT FOR CONTACTOR OR THE LIKE

[75] Inventors: John C. Culligan, Kenner, La.; Frederick A. Stich, Milwaukee, Wis.; Conrad F. Williams, New Orleans, La.

[73] Assignee: Siemens-Allis, Inc., Atlanta, Ga.

[21] Appl. No.: 537,705

[22] Filed: Sep. 30, 1983

[51] Int. Cl.³ .............................................. H01H 47/32
[52] U.S. Cl. ................................................... 361/154
[58] Field of Search ................................. 361/152, 154

[56] References Cited

U.S. PATENT DOCUMENTS 3,904,938 9/1975 Martin .................................... 361/154
4,293,888 10/1981 McCarty ............................... 361/152
4,381,532 4/1983 Arnold .................................. 361/152
4,399,483 8/1983 Phelan .................................. 361/154

Primary Examiner—Reinhard J. Eisenzopf
Attorney, Agent, or Firm—F. W. Powers; J. L. James

[57] ABSTRACT

A system for controlling current flow to the actuating coil of a contactor or the like. A solid state switch is provided for gating current flow to the coil, and operated by an oscillator stage. A time delay causes the oscillator to operate at a high duty cycle when power is initially applied, allowing a relatively high current to flow to the contactor coil to operate the contacts. Subsequently the control causes the oscillator to operate at a low duty cycle, wherein the solid state switch passes a significantly lower current flow to the coil to maintain the contacts in position.

16 Claims, 4 Drawing Figures

TIME RATIO CONTROL CIRCUIT FOR CONTACTOR OR THE LIKE

BACKGROUND OF THE INVENTION

The present invention relates to switching means for electrical circuits, and more particularly to an improved control system for limiting current flow through the actuating coil of a contactor.

It has long been recognized that electromagnetically-operated switches of the type generally termed contactors exhibit disparate current requirements for actuation and for continued operation after closure. In particular, when such a device is deenergized, an armature is normally spring-biased away from the core of an electromagnetic coil. Operation of the device is dependent upon the magnetic attraction between the core and the armature such that when current is applied to the coil magnetic flux is produced in the core, which in turn attracts the armature. The armature, in moving toward the coil core, forces the contacts of the device closed (or open, if the device is of the normally-closed type.).

Owing to commonly-understood magnetic phenomena, a substantially larger current is required to move the armature to a closed position than to maintain it there. In general, this is because the magnetic circuit exhibits a higher reluctance when open, due to the air gap; and because it is desired to rapidly operate the contacts in order to avoid arcing or burning. Frequently the coils are formed of conductor which is heavy enough to accomodate the peak, or maximum, current requirements which occur only during closure. In simple systems a constant-value voltage is applied to the coil, giving rise to a current which is sufficient to operate or "pull in" the armature. However, such current continues to flow after the armature is pulled in, even though it is far greater than what is required to maintain the armature in its closed or "holding" position. In such a case the coil must be formed of a substantially larger conductor than otherwise would be required for the "holding" current, and further must be capable of withstanding the additional thermal loads produced by the higher current. It is obviously uneconomical to operate a coil in such a fashion, i.e. to provide a constant current flow of a magnitude which is needed only for pull-in conditions. Accordingly, numerous efforts have been made to construct contactors in such a manner that a relatively high current flow is provided for pull-in operation and a lower, more economical current for "holding" operation.

One popular approach has been the so called "long wipe" contact arrangement in which an auxiliary, sliding contact is provided, and arranged in such a manner that they are engaged only during the pull-in period, i.e., when the contacts are open (or closed, in a normally-open type of contactor). A resistor is connected in series with the contactor coil, and the auxiliary or long-wipe contacts used to shunt the resistor. In this manner the resistor is effectively short-circuited during the time when the contacts are in their normal, unactuated position, but when the contactor is actuated the auxiliary contacts disengage so that the resistor limits current flow after the contactor attains its fully actuated position.

In recent years various attempts have been made to provide a still more effective circuit for economizing current levels in contactor coils. Typically, such efforts involve the use of sensitive switches or semiconductors to switch current between a low impedence and a high impedence path for effecting high and low current flows, respectively. The placing of impedences in circuit with a coil, however, is only a partial solution inasmuch as the losses in the resistance substantially offset the energy which is conserved in decreasing current flow. It will therefore be understood that it would be desirable to provide an improved current control system for a contactor or the like which allows sufficient initial current flow for pulling in the contactor, while regulating current flow to a lower value sufficient for the subsequent holding condition.

It is accordingly an object of the present invention to provide an improved current control for actuating a contactor or the like.

Another object of the invention is to provide a time ratio control system for metering current to the energizing coil of an electromagnetically-operated switch.

Yet another object is to afford an economical solid-state circuit for minimizing coil current in a contactor.

Another object is to provide an improved current ecomonizer circuit for use with a contactor or the like.

SUMMARY OF THE INVENTION

Briefly stated, in accordance with one aspect of the invention the foregoing objects are achieved by connecting a solid-state electronic switch in series with the energizing coil of a contactor, and coupling an oscillator to the switch for periodically enabling the latter. A control in the form of a time delay is coupled to the oscillator, and causes the output thereof to vary such that a first, high level of current is gated through the coil upon initial energization, while the contacts are being pulled in; and a second, lower level of current is gated to the coil by the switch subsequent to the actuation of the contactor.

In a presently preferred embodiment means are provided for cutting off the oscillator when a power supply is disabled, or when current flow ceases. Further, means are provided for adjusting current level to suit a given application. In a preferred embodiment a second solid-state switch is coupled in parallel with the coil, and selectively disabled in order to allow the coil to be rapidly deenergized. The oscillator operating the first switch may also be disabled in response to the sensed disablement of the second switch.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiments taken in conjunction with the accompanying drawings in which:

FIG. 2a represents waveforms within the circuit of FIG. 2; and

DESCRIPTION OF PREFERRED EMBODIMENTS

Figure 1:
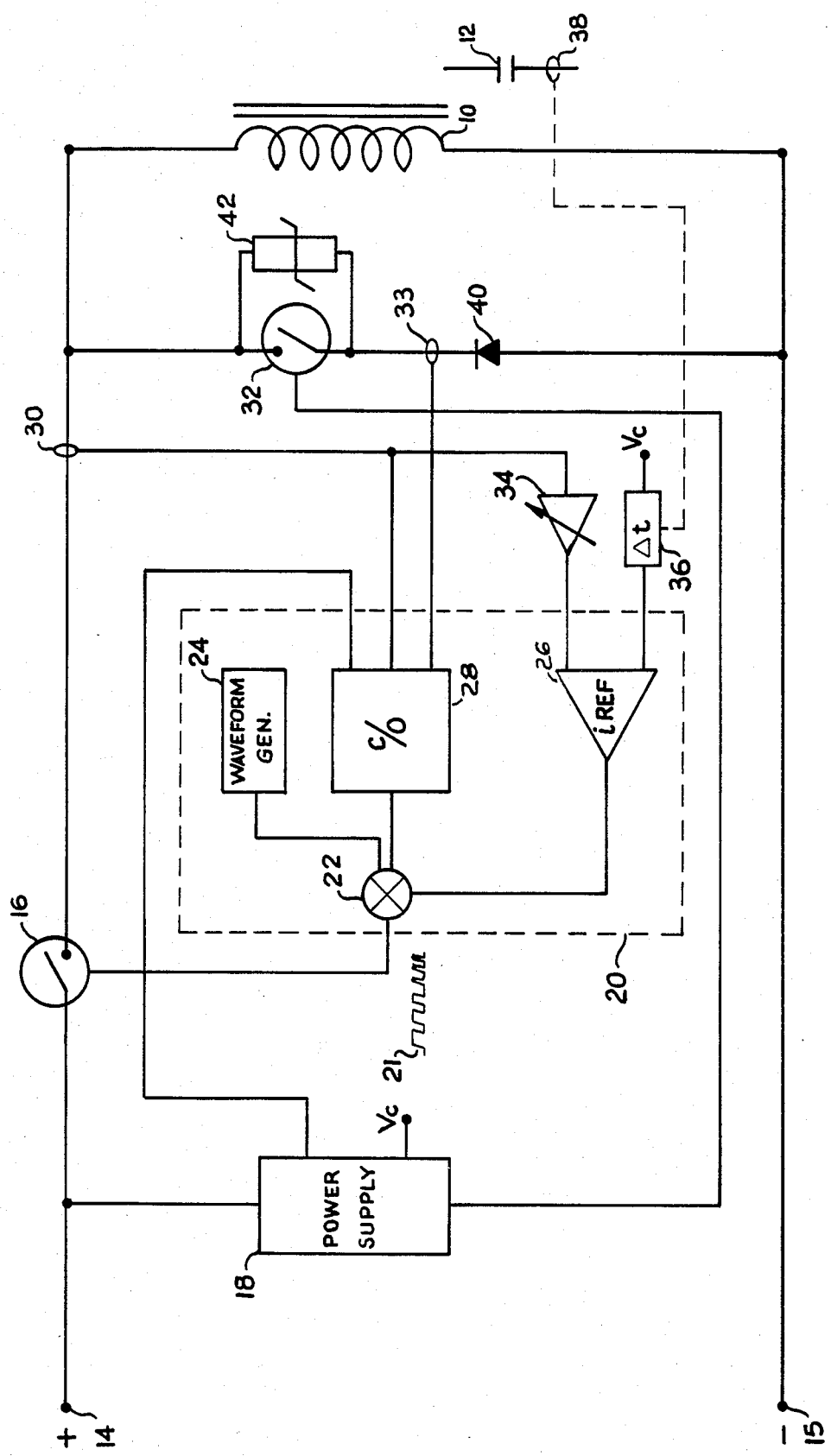
FIG. 1 is a functional schematic diagram illustrating principles of the present invention.

FIG. 1 illustrates a contactor including an electromagnetic operating coil 10 and contacts 12. It will be readily understood that the contacts are operated by means of an appropriate linkage, including an armature or the like, in response to the magnetic flux produced by coil 10 and associated core. While contacts 12 are illustrated as of the normally-open variety, it should be understood that it makes little difference whether the contactor is of the normally-open or normally-closed type. For purposes of explanation of the present embodiment of the invention, it will be assumed that the contactor is of the normally open variety, and that therefore energization of coil 10 will effect closure of the contacts. It should be remembered, however, that the invention, and the present description, is equally applicable to switches which are caused to open upon energization of the coil.

A pair of terminals 14 and 15 are adapted to be connected across a power source (not shown), represented as a source of DC voltage. A first semiconductor switch 16 is connected in series with the power source and coil 10, in order to complete a circuit or alternatively to interrupt current flow to coil 10. A power supply 18 is coupled to the input terminals and supplies a source of operating potential, conventionally denoted Vc, for other elements of the circuit. Oscillator means indicated at 20, generally within the dashed outline in the Figure, is coupled to switch 16 and outputs a train of enabling pulses, represented at 21, to the switch for enabling the latter.

A summing node generally indicated at 22 combines periodic signals from a waveform generator 24 and a reference signal stage 26 to produce the waveform 21. This output is disabled under certain conditions by signals from a cutoff stage 28 which is responsive to the status of power supply 18 and to current flowing to coil 10 as derived by an appropriate current sensor 30. The cutoff stage responds to the state of current path in the "freewheeling" loop around coil 10 and through a second solid-state switch 32 by means of another current pickup point.

The reference signal stage 26 outputs a signal dependent upon current flow, as derived by sensor 30 and adjustably amplified by an appropriate amplifier stage 34. Stage 26 is also responsive to a time-dependent signal from time delay 36. In a preferred embodiment time delay 36 is responsive to the application of power at its Vc terminal, although in another embodiment it responds to the status of contacts 12 by way of an appropriate current sensor 38.

It will be recognized that when control of current flow through an inductor such as coil 10 is effected by current chopping (otherwise known as time ratio control) it is necessary to maintain a continuous circuit about the coil and for this reason a so-called freewheeling diode 40 is coupled in inverse parallel relationship with coil 10. For reasons to be more fully explained hereinafter, the second solid-state switch 32 is connected in series with diode 40 and a nonlinear resistor 42, which may be an MOV (metal oxide varistor) coupled in parallel with switch 32.

In operation, power is applied across terminals 14 and 15, impressing a DC potential across the series combination of initially-disabled switch 16 and contactor coil 10. Since switch 16 is disabled no current flows, and contacts 12 remain open. Immediately after the application of voltage power supply 18 is energized, producing a bias voltage indicated in conventional fashion as Vc, for driving the various elements in the control circuit. In addition, a "power-on" signal, which may simply be a voltage level, is applied to cutoff stage 28, and to the control terminal of second switch 32 for enabling the latter.

Herein it should be noted that while switches 16 and 32 are shown in generic form various transistors, field effect transistors, and thyristors may be utilized. For purposes of the present description the control terminals of these devices will be referred to as "gates" although it is realized that for different devices, different names may be adopted.

With power supply 18 energized, no operating signal is produced by cutoff unit 28. The presence of ordinary levels of current flowing to coil 10 similarly produces a signal which will not operate cutoff 28. A signal from time delay 36 causes reference amplifier 26 to produce a signal which, when applied to summing node 22 allows broad enabling pulses, shown at the left hand side of form 21, to be applied to switch 16. This in turn enables the switch for a relatively large proportion of each signal period (high duty cycle), so that a relatively large current is passed to coil 10.

After some period stage 36 times out, and outputs a second level control signal to reference signal stage 26. Stage 26 then outputs a signal to node 22 which allows only relatively short enabling pulses (low duty cycle) to be applied to the gate of switch 16 during each oscillator period, represented in idealized form by the waveform at the right-hand end of wave train 21. By adjusting the time delay provided by stage 36 to be somewhat longer than the time required to close contacts 12, switch 16 is constrained to provide a relatively large pull-in current to coil 10 for operating the contacts but is shortly thereafter cut back to a time ratio mode in which a lesser current is provided, corresponding to the holding current level required to keep the contacts in a closed position. Since the holding condition is predominant, the contactor functioning in this manner for far longer periods of time than under pull-in conditions the coil 10 need not be as large and heavy, and as thermally protected, as would be the case if it had to carry the full, pull-in current value during the full operating time of the contactor. At the same time, only the energy which is sufficient to maintain the holding current level is required since current flow is controlled by the time ratio operation of switch 16 rather than being dissipated in large dropping resistors or other similarly inefficient series impedences. For this reason the present system is far more efficient than prior art controls utilizing series impedences or other current-impeding means which dissipated power.

As indicated by the dashed line from stage 36, it will be recognized that there are alternate modes of operation for the time delay unit, for instance to cause the latter to output its low-level current control signal in response to the sensed operation of contacts 12, by means of an appropriate transducer 38. Such a transducer may simply be a resistor which monitors current flow through the contacts or alternatively the voltage across the contacts, or the magnetic field of the contactor coil, any of which may be taken as an indication of contact closure. After contact closure occurs, timing stage 36 outputs a signal through reference current generator 26 which is fed to summing node 22 and which causes the time ratio of switch 16 to decrease, cutting back current flow through coil 10.

While not necessary to the functioning of the abovedescribed system, in a presently preferred embodiment a second current control switch 32 is placed in circuit with coil 10, and coupled to power supply 18. When power is applied the system, switch 32 is enabled to allow current to flow through coil 10, diode 40, and the switch. When switch 16 is closed and a positive potential is impressed at the top end of coil 10 current 10 flows downwardly through the coil and in effect shunts the circuit leg containing switch 32 and diode 40. When switch 16 is turned off, however, the sudden removal of potential from the ends of coil 10 does not cause current flow to cease, inasmuch as current flow through an inductance cannot cease immediately. If there were no alternate path for current, the inductive "kick" of coil 10 would produce a destructively high voltage across switch 16. Instead, with the depicted arrangement current flow through coil 10 continues, now flowing upwardly through diode 40 and switch 32 to form a complete circuit. In this manner, current flow through coil 10 continues despite the momentary disabling of switch 16.

When it is desired to disable a contactor, in this instance to cause contacts 12 to open, switch 16 is disabled and current flow ceases. If second switch 32 were to remain in a closed postion current flow through coil 10 would not cease for some time, and the resultant gradual weakening of the field would provide a relatively slow opening of contacts 12. This is detrimental to the contactor inasmuch as it allows an arc to be drawn, leading to pitting and destruction of the contact material. Instead, the removal of the voltage source turns off power supply 18, which in turn disables switch 32. In order to prevent a destructively high voltage from arising across switch 32, however, an impedence in the form of a varistor 42 remains in circuit so that the inductive current of coil 10 flows through diode 40 and varistor 42, rapidly dissipating in the latter without detriment to the circuit as a whole. This allows the coil current to diminish rapidly, providing sufficiently rapid opening of contacts 12 yet without producing a destructively high voltage in the inductive circuit.

Figure 2:
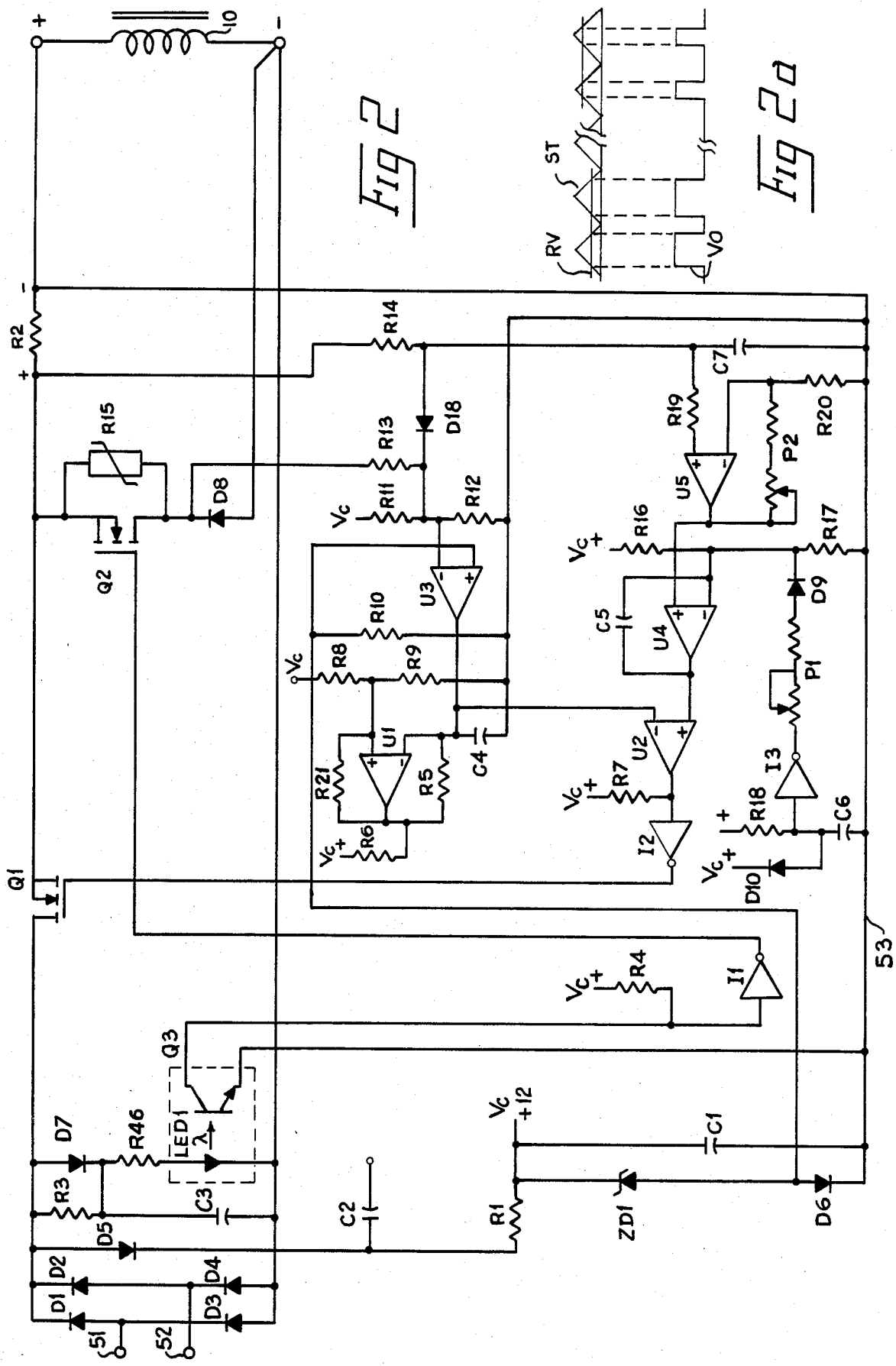
FIG. 2 is a schematic diagram illustrating one embodiment of the invention.

Referring now to FIG. 2, there is shown a presently preferred embodiment of the subject invention constructed from conventional circuit components, and illustrating in further detail an implementation of the invention.

A power source (not shown), which may be a source of AC current, is applied to terminals 51, 52 and converted to DC current by means of an ordinary bridge including diodes D1-D4. A power supply for supplying regulated low-voltage DC for operating other parts of the circuit is comprised of another diode D5 in series with a resistor R1, and a zener diode ZD1 and diode D6. The latter two elements are shunted by a capacitor C1 to provide a relatively smooth, consistent voltage Vc of substantially 12 volts. Another capacitor C2 is coupled between the intersection of diode D5 and resistor R1, and the upper end of coil 10 to serve as a temporary current source during the inter-pulse periods of the time ratio control.

It will be seen that capacitor C1, diode D6 and other elements are tied to a common bus 53 which in turn is coupled to the negative, or current-exiting end, of a resistor R2 placed in series circuit relationship with coil 10. Resistor R2 constitutes a source of a small voltage to indicate the magnitude of current flow in the coil and is of sufficiently small magnitude not to dissipate any appreciable power, in one embodiment being of the magnitude of 0.2 ohms. The positive side of resistor R2 is coupled to various points in the circuit, and serves to provide a voltage for operating states corresponding to cutoff stage 28 and current level amplifier 34 of FIG. 1.

Another source of voltage is provided by a diode D7 in series with a resistor R2a and a light-emitting diode LED 1 (actually part of a conventional optocoupler Q3) coupled across the coil in parallel with a resistor R3 and capacitor C3, substantially as shown. As indicated, LED 1 comprises an integral part of an optically-triggered transistor which is coupled between the gate of FET Q2 and bus 53. A pull-up resistor R4 and inverting buffer I1 are connected between the collector of Q3 and gate terminal of Q2. Buffer I1 and other buffers disclosed herein are preferably conventional CMAS buffers having a high input impedance and operated by a 12 volt supply.

In order to provide the requisite time-varying current output there is provided an oscillator comprising a comparator U1 having feedback resistors R21 and, R5 coupled to the positive and negative inputs thereof, and another pull-up resistor R6 coupled between the output and a source of regulated voltage Vc. The oscillator is in turn coupled to the negative input of a comparator U2 the output of which is again coupled to a source of Vc potential through resistor R7, and to the gate terminal of another FET Q1 by means of inverting buffer I2. A positive potential is provided to comparator U1 by means of a voltage divider compared of resistors R8 and R9. Another resistor R10 serves to shunt diode D6 to afford a current path thereabout. While U1 is connected for a fixed frequency output it will be apparent that a voltage feedback loop can readily be established to provide a voltage controlled oscillator.

A monitoring comparator U3 has its positive input connected to the anode of diode D6 for monitoring the presence of supply voltage Vc. The negative input of U3 is coupled to a voltage divider formed from resistors R11 and R12, which lie between a source of potential Vc and the reference bus. The negative input terminal of monitor comparator U3 is also coupled by means of resistors R13 and R14 to the freewheel circuit about coil 10, and the positive side of dropping resistor R2, respectively. The voltage drop across Q2 is monitored via resistor R13 while overcurrent in coil 10 is detected by way of R14 and diode D10. It will here be noted that the freewheel loop around the coil comprises the series combination of freewheeling diode D8 and FET Q2, the latter of which is shunted by means of a metal oxide varistor R15.

An amplified current error signal is provided to the position input of comparator U2 by operational amplifier U4, shunted by feedback capacitor C5 and having a negative-terminal input derived from a voltage divider comprised of resistors R16 and R17. Another input to the negative terminal is derived from the output of inverting buffer I3, whose output voltage is controlled by potentiometer P1 and resistor R17, and connected to the negative terminal through isolating diode D9. Input to buffer I3 is coupled to a dropping resistor R18 in combination with capacitor C6, and a clamping diode D10 allows C6 to discharge rapidly when the power supply is disabled.

The other, positive input terminal of operational amplifier U4 receives the output of a second operational amplifier U5 whose positive input is derived from the voltage drop across resistor R2, through R14 and R18. Capacitor C7 serves to filter noise from the positive input of U5. The negative input terminal has output voltage fed back through potentiometer P2 and is coupled to reference bus 53 by a resistor R19.

The illustrated embodiments of the invention are readily constructed from commercially available components. The comparators are preferably of the single supply voltage variety conventionally designated type LM339. In a successfully tested embodiment the amplifiers were constituted by type LM 324 single supply voltage operational amplifiers. However it should be understood that upon acheiving an understanding of the present invention a person skilled in the art can easily select circuit elements which are appropriate for a particular application.

In operation, when an alternating voltage is applied to input terminals 51, 52 the rectified voltage therefrom appears across the series combination of switch Q1, dropping resistor R2 and coil 10. The positive voltage produces a current flow through D5, R1, Zener diode ZD1 and diode D6, effectively making use of the voltage drop across Q1 and R2. As current begins to flow a voltage appears across diode D6 which actuates the oscillator including comparator U1. A sawtooth voltage is then produced at the upper, or negative, input terminal of comparator U2 which switches state in response thereto. Upon the production of a bias voltage Vc, resistor R7 pulls up buffer I2 which produces a negative-going voltage at the gate terminal of switch Q1, keeping the switch in a disabled mode. However, as the negative-terminal input of comparator U2 increases above the value of the reference voltage applied to the positive terminal thereof, the comparator changes states to apply a negative potential to buffer I2 with the result that a positive-going voltage is applied by the buffer to the gate of Q1, enabling the latter and allowing current to flow. The sawtooth voltage produced by the oscillator subsequently declines, ultimately causing comparator U2 to revert to its "high" output state and causing buffer I2 once more to switch to a "low" output and disabling swtich Q1.

This activity is illustrated in FIG. 2a in which the sawtooth waveform ST represents the oscillator output arising at the negative input terminal of comparator U2, and a variable-level reference voltage RV represents the voltage applied to the positive input terminal of U2. When the sawtooth voltage exceeds the reference the output of the comparator U2 goes "high" as shown by waveform UO. As the reference level RV rises the duration of the "high" output of U2 diminsihes. Since the period of the signal is constant the ratio of the "on" time to the "off" time of switch Q1, i.e., its duty cycle, declines as reference voltage RV increases.

It will now be appreciated that the percentage of "on" time of the transistor Q1 is dependent upon the relative threshold levels of the sawtooth voltage impressed on the negative terminal of comparator U2, compared with the reference voltage applied to the positive terminal thereof. In order to provide a relatively long on-time of switch Q1 it is initially desired that the reference voltage supplied to U2 be relatively low. In order to accomplish this, an RC timing circuit comprisng resistor R18 and capacitor C6 is connected across the input of buffer switch I3. As seen as the power supply is energized, voltage Vc appears at the upper end of resistor R18 and begins to charge capacitor C6. While the capacitor is charging the input to buffer I3 is "low" so that the output of the switch is relatively high, positive potential determined by a voltage divider constituted by potentiometer P1 and resistor R17. The voltage appearing at the upper end of R17 is then a relatively high voltage, applied to the negative input terminal of amplifier U4 and producing a relatively low output voltage therefrom. This low voltage, serving as the reference voltage at the positive terminal of comparator U2, allows U2 to be triggered at a relatively early point along the slope of the sawtooth wave outputted by the oscillator. U2 is then triggered 'on' relatively early in the wave period, and triggered "off" relatively late in the period, so that the on-time of U2 is relatively long for each oscillator. This effects a relatively high duty cycle of switch $Q_1$ which in turn provides relatively large current flow to coil 10. By adjusting potentiometer P1 and appropriate other circuit values, it will be understood that a time ratio may be obtained which produces a sufficient current for pull-in purposes, that is, to cause coil 10 to close the contacts associated therewith in the desired manner.

After some period of time has passed, determined by the relative values of R18 and capacitor C6, the capacitor charges sufficiently so cause buffer $I_3$ to change state (in this case, to switch to a relatively low voltage). Isolating diode D9 effectively precludes this low voltage from being applied to amplifier U4 and isolates the negative input terminal from I3 so that the voltage applied is that derived from the voltage divider formed of resistors R16 and R17. This voltage, while not so low as the voltage outputted by buffer I3, is considerably lower than that produced by I3 in its high state. Due to the higher reference voltage now appearing at the positive input terminal of comparator U2, it will not change state until the sawtooth voltage at its negative terminal has attained a higher level than before. In other words, the comparator will change state later in the period, and maintain itself in that state for a shorter period of time owing to the shorter time during which the sawtooth voltage exceeds the reference voltage. This in turn produces a much shorter-duration enabling pulse at the gate of switch Q1, so that the latter is enabled for a smaller proportion of the oscillator cycle and a commensurately smaller current is allowed to flow through coil 10.

Amplifier U4 produces an output which, after an initial time-delay period, constitutes an error signal representing the difference between a reference signal derived from voltage divider R16, R17 and an amplified current signal from amplifier U5. The output of U5, whose level is adjusted by means of potentiometer P2, constitutes current feedback which controls the error signal outputted by U4 to maintain predetermined levels of current flow for both pull-in and holding conditions.

It will be understood that the series combination of resistor 18 and capacitor C6 in connection with buffer I3 comprises a time delay function which produces a first reference voltage for effecting a higher duty cycle, and subsequently a lower reference voltage for effecting a lower duty cycle so that after an appropriate pull-in period, as determined by R18 and C6, current flow reverts to a lower level which is sufficient for maintaining the contactor in its closed or holding position.

When power is removed from the coil energizing circuit, it is desired to immediately disable switch $Q_1$ in order to isolate the coil, and to be assured that switch $Q_2$ is disabled immediately. In order to accomplish that the enabling voltage for transistor Q3 is derived from a circuit connected across the rectifying bridge. When voltage is present across the bridge output transistor Q3 is enabled, pulling down the input of buffer I1 which applies a high, enabling potential to the gate of switch Q2. When power is lost, however, transistor Q3 becomes nonconductive in which case the input of buffer I1 is pulled up through resistor R4, causing the output of the switch to drop and disabling transistor Q2. This effectively places varistor R15 in circuit about coil 10.

At the same time, the loss of input voltage produces a relatively low bias at the positive input terminal of monitoring comparator U3. This causes U3 to output relatively low voltage which overrides the output of the oscillator, causing comparator U2 to output a positive-going waveform which in turn effects the disablement of switch Q1, in this manner isolating coil 10 from the rectifier stage.

Monitoring comparator U3 also responds to situations in which current through coil 10 exceeds a desired maximum. With excess current flowing through the coil a positive voltage drop exists across resistor R2, which is communicated to the negative input terminal of comparator U3 through diode D10. In like manner if switch Q2 is disabled it applies a similar, relatively high positive voltage to the same point. This causes comparator U3 to adopt a lower output state which drives switch Q1, through comparator U2, to its disabled mode.

Figure 3:
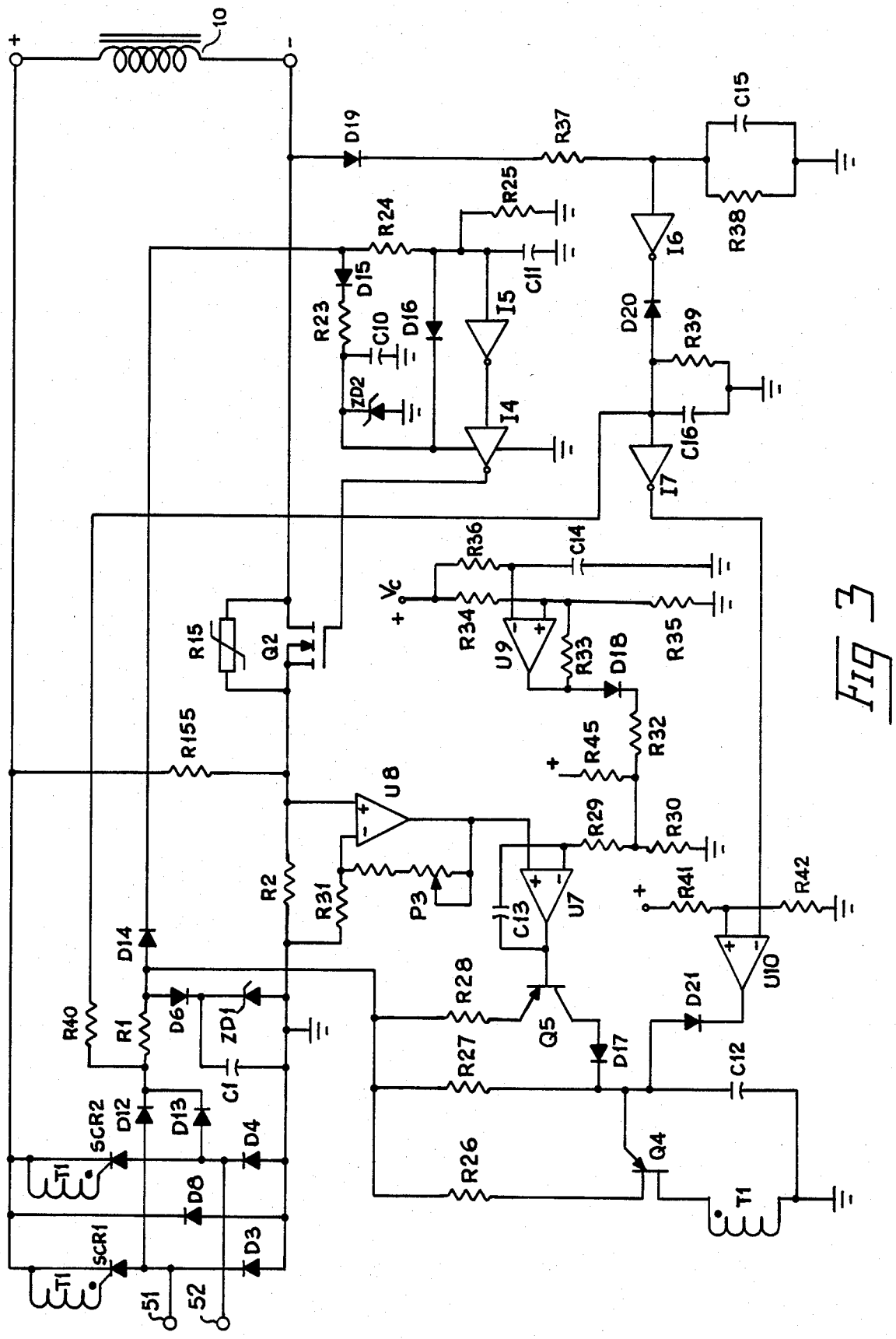
FIG. 3 is a schematic diagram showing another embodiment of the invention.

Turning now to FIG. 3 there is shown still another embodiment of the present invention, utilizing a thyristor bridge power supply rather than a single, series connected switch for metering current to a coil. As before, AC power may be applied to input terminals 51, 52 and a bridge used to rectify the current in order to provide DC power to coil 10. Diodes D1, D2 of FIG. 2 have been replaced by thyristors SCR1 and SCR2, whose gates are provided with firing signals by means of secondary windings of a transformer T1. The power supply for operating the control circuit is comprised of diodes D12 and D13, effectively coupled across coil 10 by means of a dropping resistor R1, diode D6 and Zener diode ZD1. The latter is shunted by filter or delay capacitor C1 as with the circuit of FIG. 2. Diode D8 is a freewheeling diode, as described with regard to FIG. 2. A switch for completing a freewheeling circuit about coil 10 is constituted by switch Q2, shunted by varistor R15. A resistor R155 coupled across the rectifying bridge assures that there will at all times be a path for holding current flow for the SCRs. Dropping resistor $R_2$ placed in series circuit relationship with coil 10 provides a small voltage for a current feedback signal to the control circuit. The positive bias provided by the power supply is coupled through diode D14 to a first RC circuit formed of resistors R24, R25 and capacitor C11. Diode D15 couples the circuit through R23 to a capacitor C10. Although for the sake of simplicity it is illustrated as coupled only to buffer I4, Zener diode ZD2 across C10 provides a stabilized voltage supply to all of the buffers, while diode D16 serves to clamp the voltage across capacitor C11.

The power supply is also coupled to an oscillator circuit formed of an appropriate switch, here a unijunction transistor Q4 whose base 1-base 2 circuit lies in series between resistor R26 and the primary winding of transformer T1. The emitter of Q4 is coupled to the intersection of timing resistor R27 and capacitor C12. Resistor R27 in turn is shunted by the series combination of smaller resistor R28, transistor Q5 and diode D17. Amplifier U7 has a feedback capacitor C13 connected thereabout and has its output coupled to the base of transistor Q5. The negative input thereof is coupled to a point of reference potential, herein illustrated as ground, through resistors R29 and R30.

The positive input terminal of amplifier U7 is coupled to the output of another comparator U8. A feedback potentiometer P3 and resistor R13 couple amplifier U8 around dropping resistor R2.

A time delay unit comprising an amplifier U9 is coupled by means of diode D18 and resistor R32 to the negative input of amplifier U7. A feedback loop to the positive terminal is established by means of resistor R33, and the positive terminal connected to a source of Vc potential by another resistor R34. Resistors R34 and R35 form a voltage divider for establishing a positive potential at the positive terminal of U9. This potential is modified by feedback through R33. An RC circuit comprising the series combination of resistor R36 and capacitor C14 has its intersection coupled to the negative terminal of amplifier U9.

In the present embodiment the cutoff circuit includes the combination of diode D19 and resistor R37, shunted by RC filter R38 and C15. The signal is applied to the input terminal of a buffer 16. A clamping diode D20 shunted to ground by another RC filter including the combination of resistor R39 and capacitor C16 is coupled to the power supply through resistor R40 and to the input terminal of another buffer I7. The output of I7 flows to the negative input terminal of comparator $U_{10}$, the positive terminal of which is connected to the intersection of a pair of voltage-dividing resistors R41, R42 while the output of U10 is connected to the emitter of transistor Q4 by means of isolating diode D21.

When power is first applied to the circuit SCRs 1 and 2 are inoperative, having no signals at the gate terminals thereof. Depending on whether terminal 51 or 52 is positive, diode D12 or D13 conduct current which produces a voltage drop across resistor R1 and diodes D6 and ZD1. The Vc potential arising at the intersection of resistor R1 and D6 charges capacitor C12 through timing resistor R27. When C12 attains sufficient voltage, transistor Q4 breaks over into conduction and capacitor C12 is discharged through the primary winding of transformer T1. The pulse thus induced in the secondary windings of the transformer serves to enable SCR1 and SCR2 simultaneously. It will be recognized that one of the SCRs is always forward-biased and the other always reversed-biased so that only one conducts current at any given time. The conductive SCR feeds current to the upper end of coil 10, so that a DC current flow is set up through the latter.

At the same time, the Vc potential arising between R1 and D6 is communicated through diode D14 to buffers I4 and I5. After switch Q2 is initially enabled by buffer I4 and SCRs 1 or 2 is gated on. Current now flows through the circuit, including dropping resistor R2, in so doing applying a voltage across amplifier U8 which is reflected in an output signal at the positive input terminal of amplifier U7. A relatively low voltage appears at the negative input terminal of U7, produced by the resistive voltage divider including resistors R45 and R30 so that U7 produces a relatively high output voltage which biases transistor Q5 out of conduction.

Upon initial energization of the power supply, current flows through the RC timing circuit including R36 and capacitor C14 of time delay amplifier U9. Initially a relatively high potential appears at the positive terminal thereof and a low voltage at the negative terminal with the result that a relatively high voltage is impressed upon the negative input terminal of amplifier U7, overcoming the lower Vc bias. In this manner there is provided a temporary biasing voltage which biases bypass transistor Q5 into conduction and timing capacitor C12 is charged rapidly through a relatively low resistance 28 to achieve early gating of SCRs 1 and 2 in each cycle.

After some period of time has elapsed, determined by the relative values of R36 and C14, the capacitor charges to the point where a sufficient voltage is applied to the negative input terminal of U7 driving the latter to a "low" output. Isolating diode D18 then becomes reversed biased so that the voltage at the negative input terminal of amplifier U7 is determined solely by the relative resistances of resistor R45 and R30, and the value of the Vc voltage. This lesser voltage causes amplifier U7 to regulate charging current to capacitor C12 by applying a higher output signal to transistor Q5. The RC time constant of the oscillator circuit is then determined by capacitor C12 in combination with resistors R27 and R28, diode D7 and the controlled conductivity of Q5 which as mentioned above is now considerably larger than shunt resistor R28 alone. Capacitor C12 now charges at a much slower rate, attaining the breakover voltage required for Q4 much later in the conductive cycle then before. SCRs 1 and 2 are thus gated on relatively late in the cycle, and stay on for a shorter period, so that the current gated to coil 10 is substantially less than before but sufficient to constitute the minimal holding current required to keep the contactor closed.

The desired cutoff function is provided by applying the voltage from the power supply through resistor R40 to the upper end of the filter comprised of capacitor C16 and resistor R39. With current flowing in the coil circuit diode D20 is forward biased, overcoming signals outputted by buffer I6. Buffer I7 is activated to output its "low" state to the negative input terminal of amplifier U10, whereby the positive signal produced by the latter back-biases diode D21, in effect isolating amplifier U10 from the charging circuit of the oscillator.

When the power supply is deenergized, however, the lowered voltage at the input of buffer I7 causes the latter to adopt a "high" state with the result that amplifier U10 is caused to output a negative voltage which rapidly discharges capacitor C12. In this manner the oscillator is rapidly disabled in response to the cessation of voltage output from the power supply.

In like manner, should switch Q2 turn off as would be the case during normal coil deenergization, diode D19 is forward biased and buffer I6 is caused to output a "low" state after a short delay the lower voltage is communicated through the now forward-biased diode D20, causing buffer I7 to adopt a high output state, with the result that capacitor C12 is immediately discharged. By means of the timing circuit comprising resistor R38 and capacitor C15, the "on" state of the SCRs is maintained for at least 300 milliseconds, even if power is restored to the input terminals.

As will be evident from the foregoing description, certain aspects of the invention are not limited to the particular details of the examples illustrated, and it is therefore contemplated that other modifications or applications will occur to those skilled in the art. It is accordingly intended that the appended claims shall cover all such modifications and applications as do not depart from the true spirit and scope of the invention.

What is claimed as new and desired to be secured by Letters Patent of the United States is;

1. In an electromagnetic contactor including contacts for making an electric circuit, at least one of said contacts being movable, armature means coupled to said movable contact, and an electromagnetic coil for effecting movement of said armature means, means for causing current of a first, higher value to flow through said coil in order to cause said movable contact to complete a circuit and to cause current of a second, lower value to flow through said coil after said movable contact has completed the circuit, comprising:

a first solid state electronic switch in series circuit relationship with said coil;

oscillator means for outputting a signal;

means coupling said oscillator means to said first switch for operating said first switch in response to the oscillator signal;

means for causng said oscillator means to enable said first switch at a first, higher time ratio to provide said coil with a first, higher current flow for a period sufficient to allow the contacts to operate, and for causing said oscillator means to enable said first switch at a second, lower time ratio to provide said coil with a second, lower current flow after said period, said second current flow being sufficient to maintain said contacts in an operated position.

2. The invention as defined in claim 1, further including means to vary the frequency of said oscillator means to effect a change in the time ratios at which said first switch is enabled.

3. The invention as defined in claim 1, wherein said oscillator means operates at a substantially constant frequency, including means for varying said oscillator signal to effect a change in the time ratios at which said first switch is enabled.

4. The invention as defined in claim 1, wherein said means to vary the frequency of oscillator means comprises a time delay for causing said oscillator means to change the output thereof after a predetermined period of time has elapsed.

5. The invention as defined in claim 4, wherein said control means comprises means for causing said oscillator means output to vary from said first to said second time ratio in response to the operation of the contacts.

6. The invention as defined in claim 4, further including cutoff means for disabling the output of said oscillator means response to the interruption of power supplied to said contactor coil.

7. The invention defined in claim 2, wherein said oscillator means is a free-running voltage controlled oscillator, and said control means comprises a resistor-capacitor timing circuit for providing a time-varying voltage to said voltage-controlled oscillator for producing a relative first, relatively high initial current and a second, relatively low subsequent current through said contactor coil.

8. The invention as defined in claim 1, further including a second solid state electronic switch coupled in parallel with the electromagnetic coil; a power supply coupled to an input line for said coil; and switch control means coupling said power supply to said second solid state switch for disabling said second switch in response to the disablement of said power supply.

9. The invention as defined in claim 8, further including nonlinear resistor means coupled in parallel relationship with said second solid state switch means for dissipating energy accumulated in said coil; and a diode coupled in series with said second switch means across said coil.

10. A control system for varying current flow through the actuating coil of an electric switch of the type having a pair of main contacts, one of the contacts being movable, including an armature coupled to the movable contact and responsive to energization of the actuating coil for operating the contacts, including:

terminals coupled to a source of electric power;

electronic switch means coupled in circuit between at least one of said terminals and said coil;

an oscillator stage coupled to said switching means for applying a time-varying signal thereto to cause electric current to be repeatedly interrupted, the time ratio of the uninterrupted to interrupted periods determining the rate of current flow to said coil;

timer control means coupled to said oscillator stage for causing said oscillator stage output to vary from a first time ratio for effecting a first, larger current flow through said coil to a section time ratio for effecting a second, smaller current flow.

11. The control system defined in claim 10, wherein said oscillator stage comprises a waveform generator for producing a time-varying signal;

a reference signal stage for producing a variable reference; and combining means for receiving said time-varying and said reference signals for outputting a variable time ratio control signal to said switching means.

12. The control system defined in claim 11, further including timing means coupled to said reference signal for causing the reference signal outputted by said stage to vary from a first level which effects a high duty cycle to a second level which effects a lower duty cycle.

13. The control system defined in claim 12, wherein said timing means comprises a time delay for operating said reference signal stage after a predetermined period of time.

14. The control system defined in claim 13, wherein said timing means further includes a sensor responsive to the operation of the main contacts for causing said reference signal to change state after operation of the contacts.

15. The control system defined in claim 13, wherein said oscillator stage further includes cutoff means for causing the signal outputted by said oscillator stage to disable said first swtiching means in response to discontinuance of power to said control system.

16. The control system defined in claim 15, further including current sensing means coupled in series circuit relationship with said coil, and means cooupling said current sensing means to said cutoff stage for disabling said solid stage switch in response to current which exceeds a predetermined value.

* * * * *